(12) United States Patent
Kodera et al.

(10) Patent No.: US 10,235,070 B2
(45) Date of Patent: *Mar. 19, 2019

(54) MEMORY SYSTEM HAVING A SEMICONDUCTOR MEMORY DEVICE WITH PROTECTED BLOCKS

(71) Applicant: Toshiba Memory Corporation, Tokyo (JP)

(72) Inventors: Shunsuke Kodera, Yokohama Kanagawa (JP); Toshihiko Kitazume, Kawasaki Kanagawa (JP); Kenichirou Kada, Yokohama Kanagawa (JP); Nobuhiro Tsuji, Yokohama Kanagawa (JP); Shinya Takeda, Yokohama Kanagawa (JP); Tetsuya Iwata, Yokohama Kanagawa (JP); Yoshio Furuyama, Yokosuka Kanagawa (JP); Hirosuke Narai, Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 8 days.

This patent is subject to a terminal disclaimer.

(21) Appl. No.: 15/439,859

(22) Filed: Feb. 22, 2017

(65) Prior Publication Data

US 2017/0160972 A1 Jun. 8, 2017

Related U.S. Application Data

(63) Continuation of application No. 15/051,882, filed on Feb. 24, 2016.

(30) Foreign Application Priority Data

Aug. 28, 2015 (JP) ................................ 2015-169678

(51) Int. Cl.
*G06F 3/06* (2006.01)
*G11C 5/06* (2006.01)
(Continued)

(52) U.S. Cl.
CPC ............ *G06F 3/0622* (2013.01); *G06F 3/064* (2013.01); *G06F 3/0637* (2013.01);
(Continued)

(58) Field of Classification Search
None
See application file for complete search history.

(56) References Cited

U.S. PATENT DOCUMENTS 5,673,222 A 9/1997 Fukumoto et al.
5,912,849 A 6/1999 Yasu et al.
(Continued)

FOREIGN PATENT DOCUMENTS

JP H10106275 A 4/1998
JP 2000215108 A 8/2000
(Continued)

OTHER PUBLICATIONS

Toshiba Serial Interface NAND Technical Data Sheet, Rev. 0.2, Jun. 19, 2015, Toshiba Semiconductor & Storage Products Memory Division, TC58CVG0S3HTA00, 39 pages.
(Continued)

*Primary Examiner* — J. H. Hur
(74) *Attorney, Agent, or Firm* — Kim & Stewart LLP

(57) ABSTRACT

A memory system includes a semiconductor memory device including a plurality of blocks, and a controller configured to register a block designated in a protection command as a protected block in a storage region. When the control circuit receives from a host a command to erase the protected block or write to the protected block, the control circuit does not issue a corresponding erase or write command to the semi-
(Continued)

conductor memory device and notifies the host of the failure to execute the command.

18 Claims, 20 Drawing Sheets

(51) Int. Cl.
    *G11C 7/10*          (2006.01)
    *G11C 16/22*       (2006.01)

(52) U.S. Cl.
    CPC .......... *G06F 3/0655* (2013.01); *G06F 3/0659* (2013.01); *G06F 3/0679* (2013.01); *G11C 5/066* (2013.01); *G11C 7/1063* (2013.01); *G11C 16/22* (2013.01)

(56) References Cited

U.S. PATENT DOCUMENTS

| | | | |
|---|---|---|---|
| 7,249,231 B2 | 7/2007 | Babudri et al. | |
| 7,307,894 B2 | 12/2007 | Kido et al. | |
| 7,310,277 B2 | 12/2007 | Komiya et al. | |
| 8,111,551 B2 | 2/2012 | Tanaka et al. | |
| 2001/0011318 A1 | 8/2001 | Dalvi et al. | |
| 2004/0141379 A1* | 7/2004 | La Malfa | G11C 16/12 365/185.33 |
| 2004/0205314 A1* | 10/2004 | Babudri | G06F 12/1425 711/103 |
| 2006/0164886 A1 | 7/2006 | Tanaka et al. | |
| 2009/0113118 A1* | 4/2009 | Lee | G06F 12/0246 711/103 |

FOREIGN PATENT DOCUMENTS

| | | |
|---|---|---|
| JP | 2005108273 A | 4/2005 |
| JP | 2006-127648 A | 5/2006 |
| JP | 2015134061 A | 7/2015 |
| TW | I351606 B | 11/2011 |

OTHER PUBLICATIONS

Taiwan Office Action dated Apr. 12, 2017, filed Taiwan counterpart Application No. 105103845, 12 pages (with translation).

Japanese Office Action dated Apr. 19, 2018, filed in Japanese counterpart Application No. 2015-169678, 12 pages (with translation).

* cited by examiner

FIG. 3

| Pin no. | Pin function |
|---|---|
| 1 | Hold input(/HOLD) / serial data output3(SO3) |
| 2 | Power supply(Vcc) |
| 3 | No connection(NC) |
| 4 | No connection(NC) |
| 5 | No connection(NC) |
| 6 | No connection(NC) |
| 7 | Chip select(/CS) |
| 8 | Serial data output(SO) / serial data output1(SO1) |
| 9 | Write protect(/WP) / serial data output2(SO2) |
| 10 | Ground(Vss) |
| 11 | No connection(NC) |
| 12 | No connection(NC) |
| 13 | No connection(NC) |
| 14 | No connection(NC) |
| 15 | Serial data input(SI) / serial data output0(SO0) |
| 16 | Serial clock input(SCK) |

FIG. 4

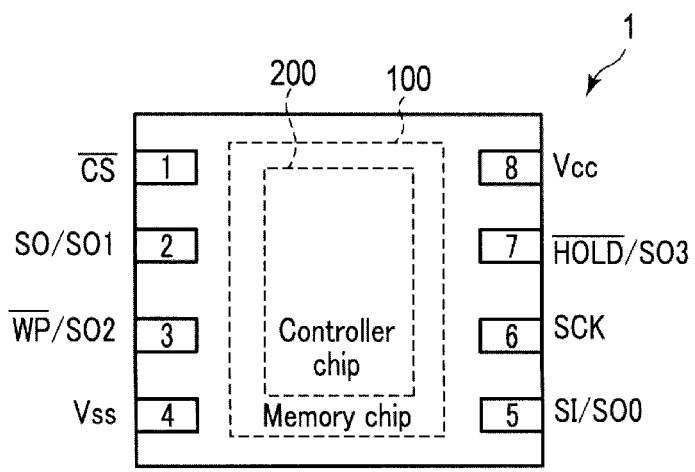

FIG. 5

| Pin no. | Pin function |
|---|---|
| 1 | Chip select(/CS) |
| 2 | Serial data output(SO) / serial data output1(SO1) |
| 3 | Write protect(/WP) / serial data output2(SO2) |
| 4 | Ground(Vss) |
| 5 | Serial data input(SI) / serial data output0(SO0) |
| 6 | Serial clock input(SCK) |
| 7 | Hold input(/HOLD) / serial data output3(SO3) |
| 8 | Power supply(Vcc) |

| Block address | Flag |
|---|---|
| 0 | 0 |
| 1 | 0 |
| 2 | 1 |
| ⋮ | ⋮ |
| 1023 | 0 |

MEMORY SYSTEM HAVING A SEMICONDUCTOR MEMORY DEVICE WITH PROTECTED BLOCKS

CROSS-REFERENCE TO RELATED APPLICATIONS

This application is a continuation of U.S. patent application Ser. No. 15/051,882, filed on Feb. 24, 2016, which is based upon and claims the benefit of priority from Japanese Patent Application No. 2015-169678, filed Aug. 28, 2015, the entire contents of each of which are incorporated herein by reference.

FIELD

An embodiment described herein relates generally to a memory system, in particular, a memory system that having a semiconductor memory device with protected bocks.

BACKGROUND

A NAND-type flash memory is widely known as one type of a memory device.

DESCRIPTION OF THE DRAWINGS

FIG. 3 illustrates functions of external terminals of the memory system according to the embodiment.

FIG. 4 is an exterior plan view of another memory system according to the embodiment.

FIG. 5 illustrates functions of external terminals of the memory system shown in FIG. 4.

DETAILED DESCRIPTION

Figure 1:
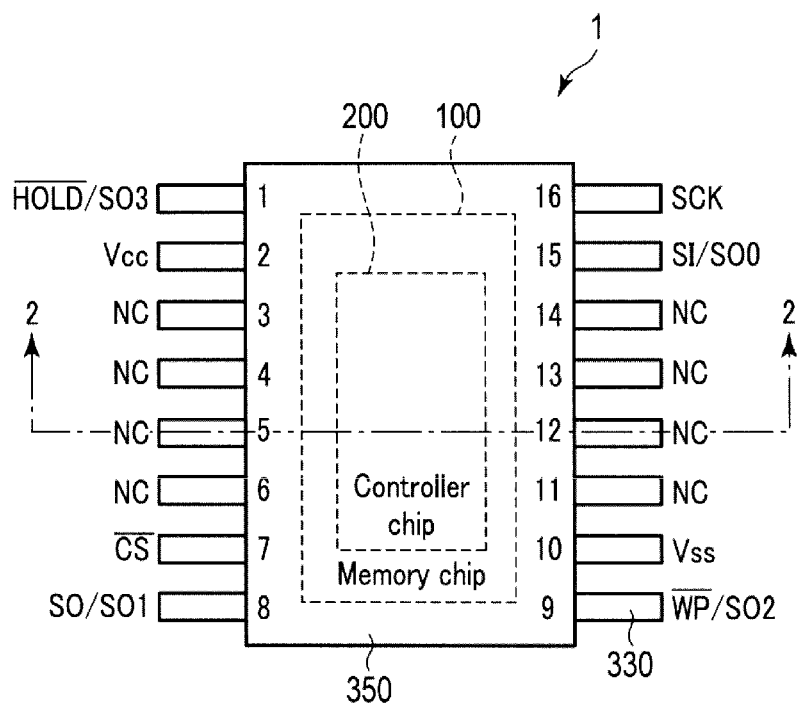
FIG. 1 is an exterior plan view of a memory system according to an embodiment.

The embodiment provides a memory system capable of performing a block protection process as a separate process.

In general, according to an embodiment, a memory system includes a semiconductor memory device including a plurality of blocks, and a controller configured to register a block designated in a protection command as a protected block in a storage region. When the control circuit receives from a host a command to erase the protected block or write to the protected block, the control circuit does not issue a corresponding erase or write command to the semiconductor memory device and notifies the host of the failure to execute the command.

Hereinafter, an embodiment will be described with reference to the drawings. In the following description, elements having the same function and configuration are described with the same reference numerals.

1. Embodiment

A memory system according to an embodiment will be described.

1.1 Configuration 1.1.1 Entire Configuration of Memory System

First, an entire configuration of the memory system according to the present embodiment will be described with reference to FIGS. 1 and 2. FIG. 1 is an exterior plan view of the memory system according to the present embodiment, and FIG. 2 is a cross-sectional view thereof taken along the line II-II in FIG. 1.

As illustrated, a memory system 1 includes two semiconductor chips (modules) 100 and 200. The semiconductor chip (memory chip) 100 includes a semiconductor memory such as a NAND-type flash memory, and the semiconductor chip 200 (controller chip) includes a controller which controls the memory chip 100. The semiconductor chips 100 and 200 are mounted on a lead frame 300, and are packaged by being sealed with a resin 350.

Figure 2:
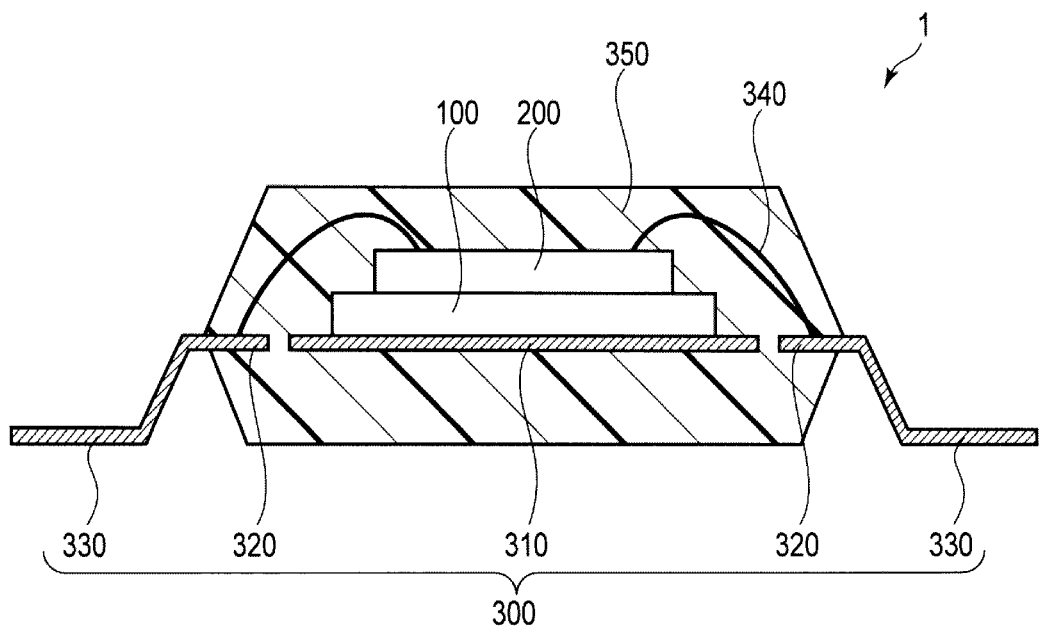
FIG. 2 is a cross-sectional view of the memory system according to the embodiment.

More specifically, as illustrated in FIG. 2, the memory chip 100 is mounted on a die pad 310 of the lead frame 300, and the controller chip 200 is superposed on the memory chip 100.

The controller chip 200 is connected to an inner lead 320 of the lead frame via, for example, a bonding wire 340, and is also connected to the memory chip 100 via a bonding wire (not illustrated). The memory chip 100, the controller chip 200, the die pad 310, the inner lead 320, and the bonding wire 340 are sealed with, for example, the resin 350.

The inner lead 320 is connected to an outer lead 330 which is exposed to the outside of the resin 350. The outer lead 330 functions as an external connection terminal (external connection pin) of the memory system 1. In FIG. 1, sixteen external connection terminals including a first pin to a sixteenth pin are provided. The memory system 1 performs communication with a host apparatus which controls the memory system 1 (more specifically, accesses the memory chip) via the pins.

FIG. 3 illustrates functions of the respective pins. As illustrated, the first pin is used to receive a control signal /HOLD, or to output serial data SO3. The control signal /HOLD is asserted (has an "L" level) when communication between the host apparatus and the memory system 1 is temporarily stopped. The second pin receives a power supply voltage Vcc. The third to sixth pins and the eleventh to fourteenth pins are reserved pins, and may be used, for example, when a certain signal or data are required to be transmitted and received in the future. The seventh pin receives a chip select signal /CS. The chip select signal /CS is a signal for activating the memory chip 100 and the controller chip 200 (in other words, a signal is asserted when accessing the memory system 1), and is asserted (has an "L" level), for example, at a timing at which the host apparatus inputs a command to the memory system 1. The eighth pin is used to output serial data (SO or SO1). The ninth pin is used to receive a control signal /WP or to output serial data (SO2). The control signal /WP is a write protect signal, and is asserted (has an "L" level) when writing to the memory chip is prohibited. The tenth pin receives a reference potential Vss. The fifteenth pin is used to receive serial data (SI) or to output serial data (SO0). The sixteenth pin receives a serial clock signal SCK.

The pin configuration conforms to the serial peripheral interface (SPI). The first pin, the eighth pin, the ninth pin, and the fifteenth pin are arbitrarily selected for use in outputting serial data, and can output data to the host apparatus at 1-time speed, 2-time speed or 4-time speed.

FIG. 4 illustrates an example of a package configuration which is different from the one illustrated in FIG. 1. In FIG. 4, eight external connection terminals including first to eighth pins are provided. FIG. 5 illustrates functions of the respective pins shown in FIG. 4.

As illustrated, the first pin receives the chip select signal /CS. The second pin outputs the serial data SO and SO1. The third pin receives the write protect signal /WP or outputs the serial data SO2. The fourth pin receives the reference potential Vss. The fifth pin receives the serial data SI or outputs the serial data SO0. The sixth pin receives the serial clock. The seventh pin receives the control signal /HOLD or outputs the serial data SO3. The eighth pin receives the power supply voltage Vcc. Also in this case, the pin configuration conforms to the SPI.

Figure 6:
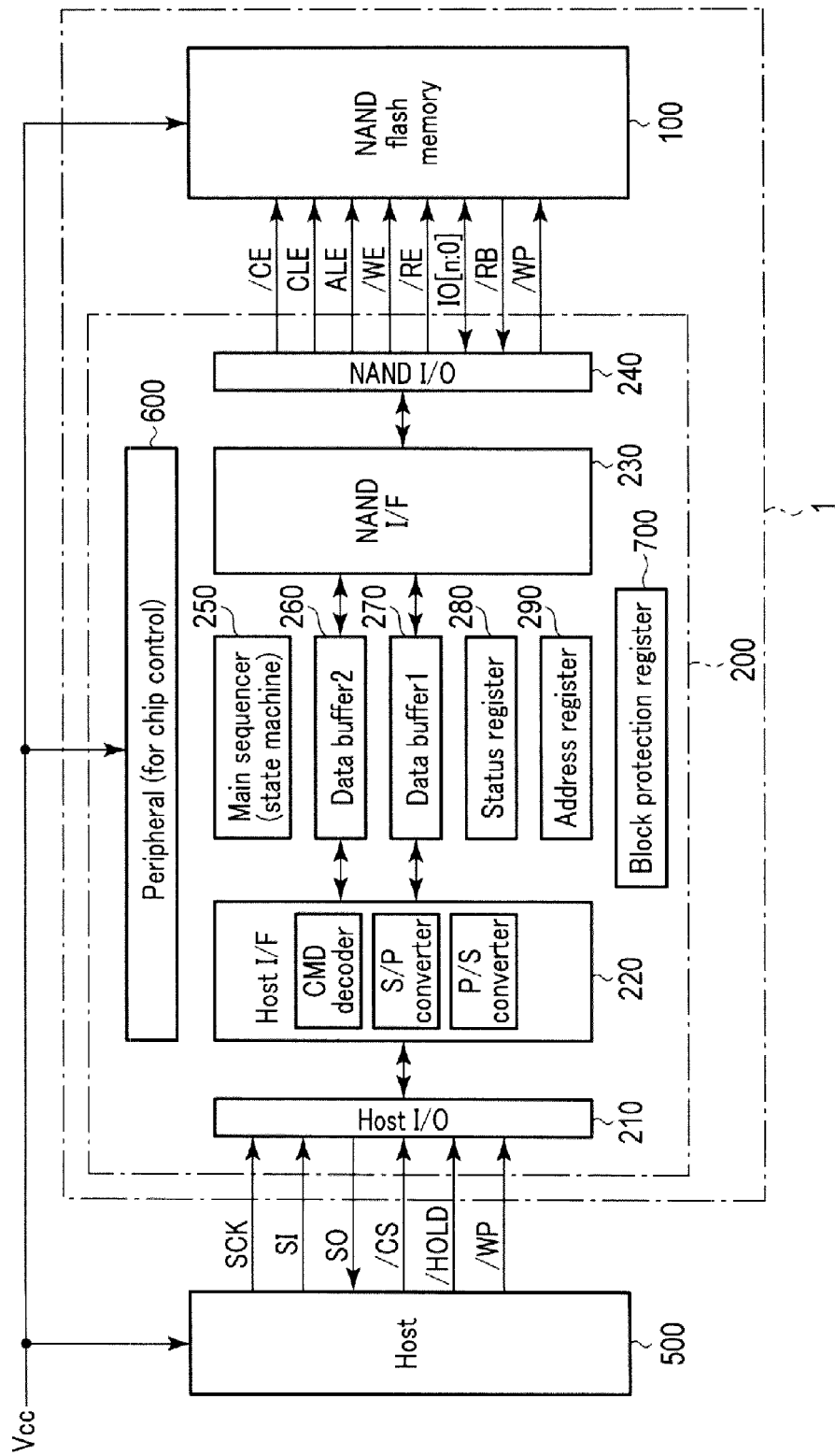
FIG. 6 is a block diagram of the memory system according to the embodiment.

FIG. 6 is a functional block diagram illustrating an internal configuration of the memory system 1. Hereinafter, the memory chip 100 is referred to as a NAND-type flash memory 100, and the controller chip 200 is simply referred to as a controller 200.

As illustrated, the memory system 1 includes the NAND-type flash memory 100 and the controller 200.

The NAND-type flash memory 100 includes a plurality of memory cells and stores data in a nonvolatile manner. The controller 200 is connected to the NAND-type flash memory 100 via NAND buses, and is connected to a host apparatus 500 via SPI buses. The controller 200 controls access to the NAND-type flash memory 100.

Each of the NAND buses performs transmission and reception of signals based on a NAND interface protocol. Specific examples of the signals include a chip enable signal /CE, an address latch enable signal ALE, a command latch enable signal CLE, a write enable signal /WE, a read enable signal /RE, a ready busy signal /RB, an input or output signal I/O, and a write protect signal /WP.

The signal /CE is asserted in a low level so as to activate the NAND-type flash memory 100, when accessing the NAND-type flash memory 100. The signals CLE and ALE are used to notify the NAND-type flash memory 100 that input signals I/O to the NAND-type flash memory 100 are respectively a command and an address. The signal /WE is asserted in a low level so that the input signal I/O is input into the NAND-type flash memory 100. The signal /RE is also asserted in a low level so that the output signal I/O is read from the NAND-type flash memory 100. The ready busy signal /RB indicates whether the NAND-type flash memory 100 is in a ready state (a state of being capable of receiving a command from the controller 200) or in a busy state (a state of being incapable of receiving a command from the controller 200), and a low level thereof indicates the busy state. The input or output signal I/O is, for example, an 8-bit (n=8) signal. The input or output signal I/O contains data which are transmitted and received between the NAND-type flash memory 100 and the controller 200, and includes a command, an address, data to be written, or read data. The signal /WP is a signal for inhibiting data from being written to the NAND-type flash memory 100.

The SPI buses are substantially similar to the ones described with reference to FIGS. 3 and 5.

1.1.2 Configuration of Controller 200

Next, with reference to FIG. 6, details of a configuration of the controller 200 will be described. As illustrated, the controller 200 includes a host input/output circuit 210, a host interface circuit 220, a NAND interface circuit 230, a NAND input/output circuit 240, a sequencer (state machine) 250, data buffers 260 and 270, a status register 280, an address register 290, a block protection register 700, and a peripheral circuit 600.

The host input/output circuit 210 functions as a buffer of signals which are transmitted to and received from the host apparatus 500. The signals SCK, SI, /CS, /HOLD and /WP are first received by the host input/output circuit 210 and are then output to the host interface circuit 220.

The host interface circuit 220 receives the signal SI in synchronization with the signal SCK. The host interface circuit 220 transmits the signal SO which is received in synchronization with the signal SCK, to the host apparatus 500 via the host input/output circuit 210.

The host interface circuit 220 controls transmission and reception of signals with the host apparatus 500 via the host input/output circuit 210. The host interface circuit 220 functions as a serial/parallel converter and a parallel/serial converter. For example, the input signal SI from the host apparatus 500 is converted from a serial signal into a parallel signal, and data read from the NAND-type flash memory 100 is converted from a parallel signal into a serial signal. If the input signal SI is a command, the host interface circuit 220 functions as a command decoder and decodes the received command. A decoded result is output to, for example, the sequencer 250.

The data buffers 260 and 270 temporarily holds data to be written that are received from the host apparatus 500, via the host interface circuit 220. Data read from the NAND-type flash memory 100 is received via the NAND interface circuit 230 and temporarily held.

The status register 280 holds various kinds of status information of the memory system 1. For example, a feature table (described below) is held.

The address register 290 holds an address received from the host apparatus 500, via the host interface circuit 220.

The NAND interface circuit 230 controls transmission and reception of signals to and from the NAND-type flash memory 100 via the NAND input/output circuit 240. The NAND interface circuit 230 issues various commands conforming to the NAND interface protocol in response to a command from the sequencer 250, and outputs the commands to the NAND-type flash memory 100 along with an address in the address register 290 via the NAND input/output circuit 240. During writing of data, the data in the data buffer 260 and/or 270 are output to the NAND-type flash memory 100 via the NAND input/output circuit 240. During reading of data, data read from the NAND-type flash memory 100 is transmitted to the data buffer 260 and/or 270.

The NAND input/output circuit 240 functions as a buffer of signals which are transmitted to or received from the NAND-type flash memory 100. The NAND input/output circuit 240 asserts or deasserts the signals /CE, CLE, ALE, /WE, /RE and /WP in response to commands from the NAND interface circuit 230. During reading of data, the NAND input/output circuit 240 temporarily holds a signal IO (read data) and transmits the signal to the NAND interface circuit 230. During writing of data, the NAND input/output circuit 240 temporarily holds a signal IO (data to be written) and transmits the signal to the NAND-type flash memory 100. The ready busy signal /RB is received from the NAND-type flash memory 100 and is transmitted to the NAND interface circuit 230.

The sequencer 250 controls the entire operation of the controller 200. For example, if a data reading request is received from the host apparatus 500, the sequencer 250 instructs the NAND interface circuit 230 to execute an operation for performing a reading operation. If a data writing request is received from the host apparatus 500, the sequencer 250 instructs the NAND interface circuit 230 to execute an operation for performing a writing operation. The feature table in the status register 280 is updated based on status information received from the NAND-type flash memory 100.

The block protection register 700 stores block protection information. For example, if there is a block protection request from the host apparatus 500, the block protection register 700 writes flag information to an entry indicating a protection target block. The flag information is set as "1" if a block is protected, and is set as "0" if the block is not protected.

The peripheral circuit 600 receives the power supply voltage Vcc from an external device, transmits the voltage to each circuit block, and performs other control which is necessary in an operation of the controller 200.

1.1.3 Configuration of NAND-Type Flash Memory 100

Figure 7:
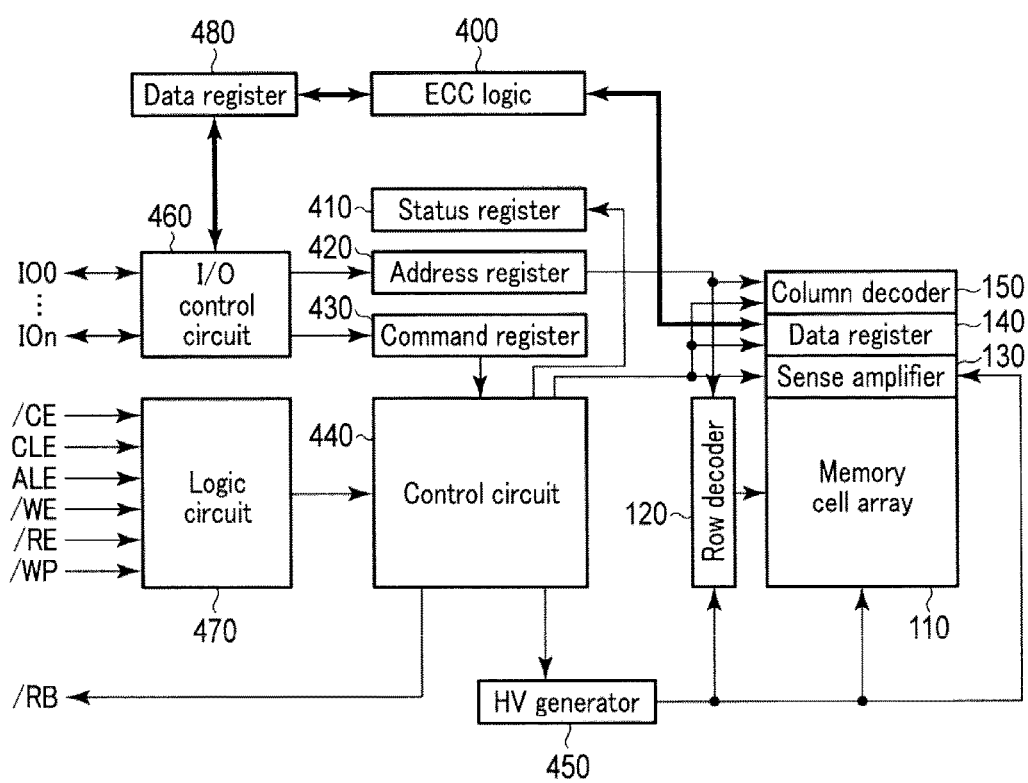
FIG. 7 is a block diagram of a semiconductor memory device according to the embodiment.

Next, with reference to FIG. 7, a configuration of the NAND-type flash memory 100 will be described. FIG. 7 is a block diagram of the NAND-type flash memory 100.

As illustrated, the NAND-type flash memory 100 includes a memory cell array 110, a row decoder 120, a sense amplifier 130, a data register 140, a column decoder 150, an error correction code (ECC) circuit 400, a status register 410, an address register 420, a command register 430, a control circuit 440, a voltage generation circuit 450, an input/output control circuit 460, a logic circuit 470, and a data register 480.

The memory cell array 110 includes a plurality of non-volatile memory cells arranged in rows and columns. Memory cells in the same row are connected to the same word line, and the memory cells in the same column are connected to the same bit line. Reading and writing of data are collectively performed on a plurality of memory cells connected to the same word line. This unit of reading and writing of data is referred to as a page. Data corresponding to one page includes net data and management data. The net data are managed in the unit called a sector. For example, in the present embodiment, one page includes four sectors, and each sector has a data size of 512 bytes. The management data include, for example, ECC data (parity) for correcting errors. The error correction is performed on a per sector basis. Therefore, the management data include ECC data which are prepared for one sector. Erasing of data is collectively performed in units of a plurality of pages, referred to as a block.

The row decoder 120 decodes a row address for designating a row of the memory cell array 110. A word line is selected based on a decoded result, and voltages which are required to write, read, and erase data are applied thereto.

During reading of data, the sense amplifier 130 senses data read from the memory cell array 110 and transmits the data to the data register 140. During writing of data, data in the data register 140 are transmitted to the memory cell array 110.

The data register 140 temporarily holds data to be written or read data corresponding to one page.

The column decoder 150 decodes a column address of a column of the memory cell array 110. Based on a decoded result, data are transmitted to the data register 140 during writing of data, and data are read from the data register 140 during reading of data.

The ECC circuit 400 performs error detection and error correction processes. More specifically, during writing of data, the ECC circuit 400 generates parity for each sector based on data received from the controller 200, and transmits the parity and net data to the data register 140. During reading of data, the ECC circuit 400 generates a syndrome for each sector based on parity included in data transmitted from the data register 140, and detects the presence or absence of an error. If an error is detected, a bit position thereof is specified, and the error is corrected. The number of error bits which can be corrected for each sector is, for example, 8 bits per sector in the present embodiment. The ECC circuit 400 may output the number of error bits detected in each sector to the status register 410 as status information.

The logic circuit 470 receives the signals /CE, CLE, ALE, /WE, /RE and /WP from the controller 200.

The input/output control circuit 460 receives a signal IO [n:0]. If the signal IO is an address (if ALE="H"), the input/output control circuit 460 holds the address in the address register 420. If the signal IO is a command (if CLE="H"), the command is held in the command register 430. If the signal IO is data (if ALE=CLE="L"), the data are held in the data register 480.

The status register 410 holds various kinds of status information of the NAND-type flash memory 100. The status information includes information indicating the number of error bits provided from the ECC circuit 400, and information indicating whether or not a writing operation and a reading operation is successful (passed) or unsuccessful (failed), provided from the control circuit 440.

The control circuit 440 controls the NAND-type flash memory 100 based on commands held in the command register 430 and various signals input to the logic circuit 470. The control circuit 440 generates the ready busy signal /RB and outputs the signal to the controller 200.

The voltage generation circuit 450 generates voltage required in data writing, reading and erasing operations based on a command from the control circuit 440, and supplies the voltages to the memory cell array 110, the row decoder 120, and the sense amplifier 130.

1.2 Operations

Next, data reading, writing, and erasing operations in the memory system according to the present embodiment will be described, focusing on signals which are transmitted and received via the SPI buses and the NAND buses.

1.2.1 Reading Operation

First, the reading operation will be described. The reading operation includes the following three steps.

(1) Reading of data from the NAND-type flash memory: Through this step, data are read from the NAND-type flash memory 100 to the controller 200.

(2) Feature table reading (referred to as Get feature in some cases): Through this step, whether the memory system 1 is in a busy state or a ready state is determined, that is, whether or not the operation in the step (1) is completed is determined.

(3) Reading of data from the controller 200: Through this step, the data read to the controller 200 in the step (1) is read to the host apparatus 500.

Figure 8:
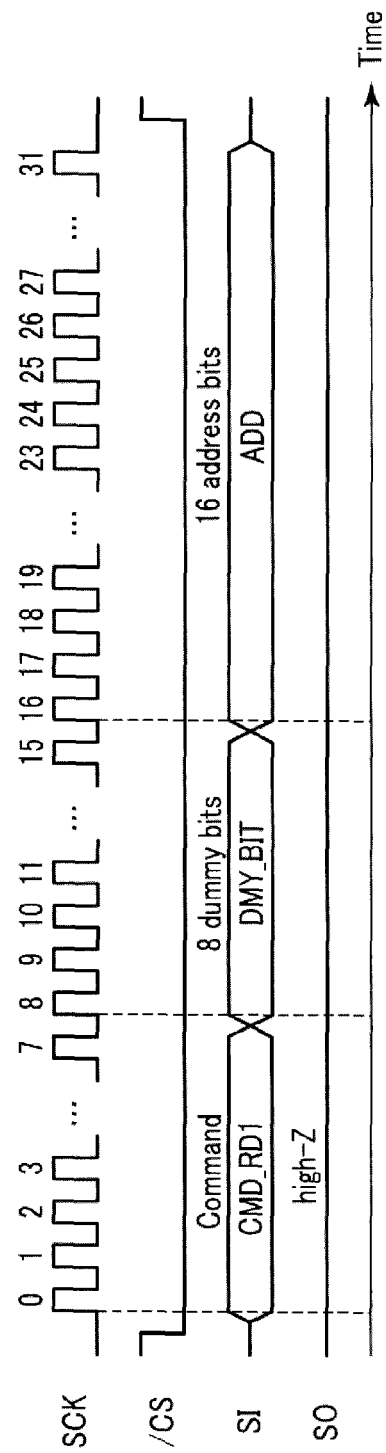
FIGS. 8-11 are timing charts of various signals during reading of data in the memory system according to the embodiment.

FIG. 8 is a timing chart of various signals on the SPI buses during execution of the step (1). As illustrated, the host apparatus 500 asserts the signal /CS, issues a first read command CMD_RD1 as the signal SI, and also issues the clock SCK.

The host interface circuit 220 of the controller 200 recognizes the signal SI when the signal /CS is asserted and the initial clock SCK is received, as a command. The command is, for example, an 8-bit signal which is input for 8 clock cycles. The first read command CMD_RD1 is received, and then the sequencer 250 starts a data reading sequence.

Next, the host apparatus 500 transmits dummy bits DMY_BIT to the controller 200, for example, for 8 clock cycles, and then transmits an address ADD to the controller 200, for example, for 16 clock cycles. After the address ADD is transmitted, the host apparatus 500 deasserts the signal /CS. The address ADD is an address for designating a block and a page in the NAND-type flash memory 100, and is held in the address register 290.

As described above, when a specific command is received, what kind of signal is subsequently input (command sequence) is defined in advance. In other words, for example, if the first read command CMD_RD1 is received, the controller 200 recognizes that the signal SI which is input for subsequent 8 clock cycles is meaningless dummy data, and the signal SI which is input in subsequent 16 clock cycles is an address signal.

Figure 9:
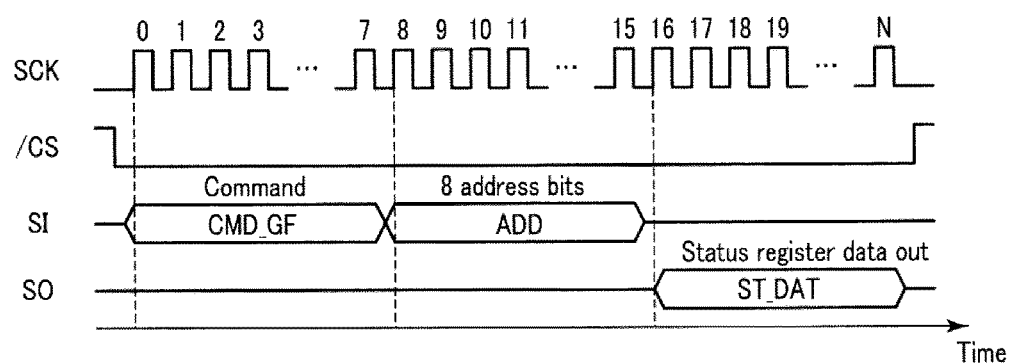

The operation in the step (2) is performed following the operation in the step (1). FIG. 9 is a timing chart of various signals on the SPI buses during execution in the step (2). As illustrated, the host apparatus 500 asserts the signal /CS again, issues a Get feature command CMD_GF as the signal SI, and also issues the clock SCK.

Next, the host apparatus 500 transmits an address ADD to the controller 200, for example, for 8 clock cycles. The address ADD is in the feature table, and naturally designates a region in which ready busy information is stored. In the controller 200, after the address ADD is received, the host interface circuit 220 reads an entry designated in the feature table from the status register 280 in response to a command from the sequencer 250, and transmits the entry to the host apparatus 500 as 8-bit status data ST_DAT for 8 clock cycles. The status data ST_DAT includes the ready busy information. After the status data ST_DAT is received, the host apparatus 500 deasserts the signal /CS.

Figure 10:
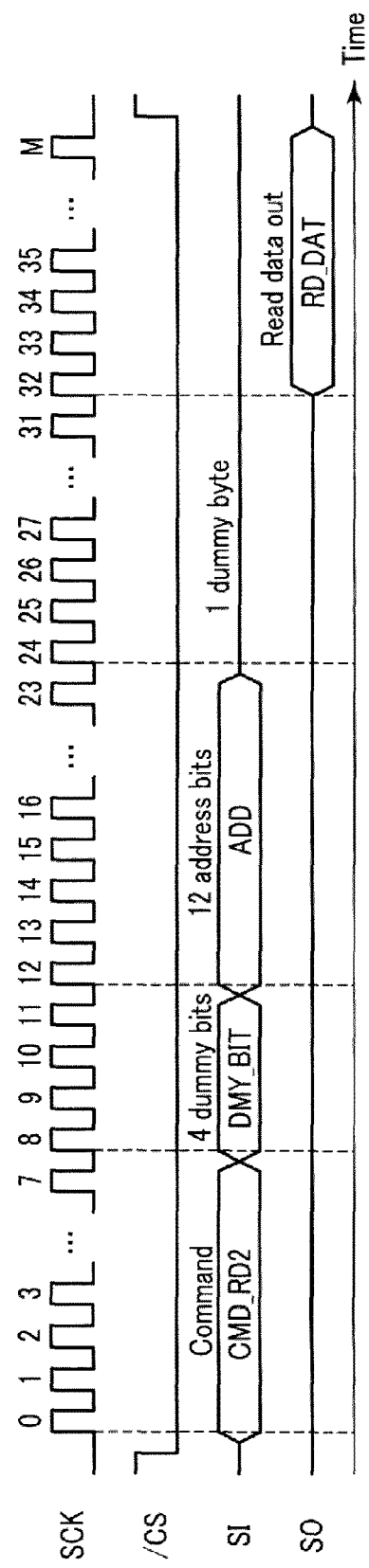

If the received status data ST_DAT indicates that the memory system 1 is in a ready state, the operation in the step (3) is performed. FIG. 10 is a timing chart of various signals on the SPI bus during execution of the step (3). As illustrated, the host apparatus 500 asserts the signal /CS, issues a second read command CMD_RD2 as the signal SI, and also issues the clock SCK.

Next, the host apparatus 500 transmits dummy bits DMY_BIT to the controller 200, for example, for 4 clock cycles, and then transmits an address ADD to the controller 200, for example, for 12 clock cycles. The address ADD designates a region in the data buffer 260 or 270 of the controller 200, and designates a column of a page in the NAND-type flash memory 100. The address ADD is held in the address register 290. Then, the host interface circuit 220 reads data from the data buffer 260 or 270, for example, under the control of the sequencer 250. After the 8 clock cycles, the host interface circuit 220 transmits the data RD_DAT read from the data buffer 260 or 270 to the host apparatus 500.

Figure 11:
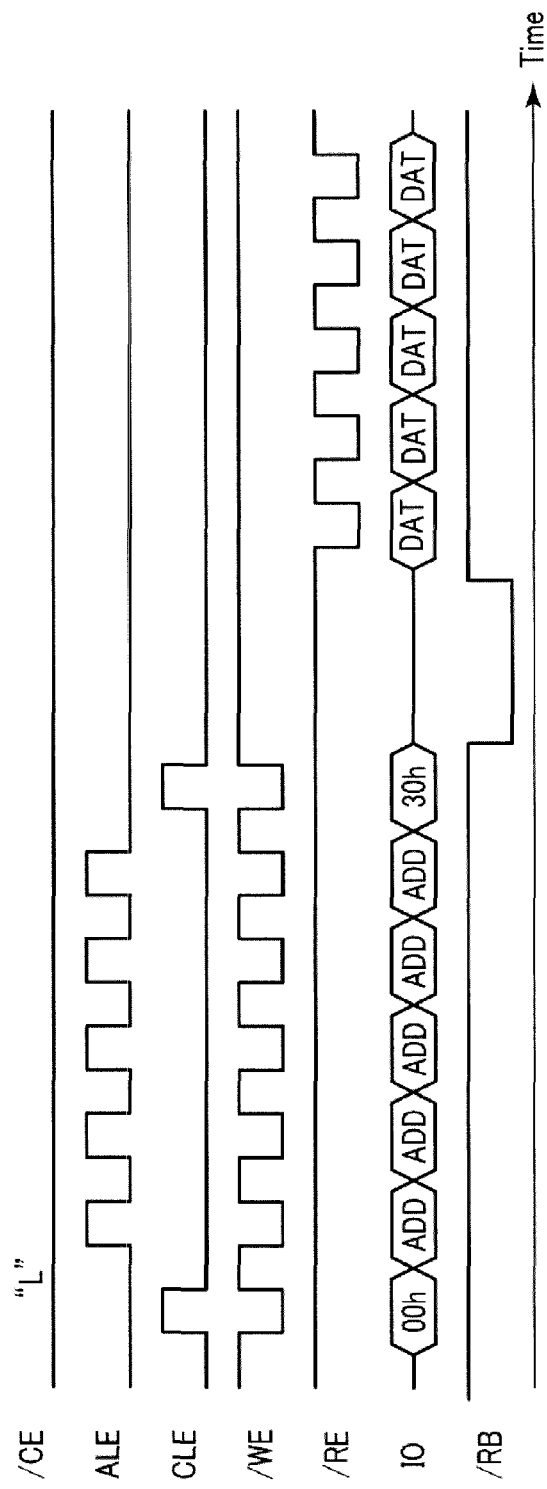

FIG. 11 is a timing chart of various signals on the NAND bus during execution of the step (1). After the first read command CMD_RD1 is received in the controller 200, the NAND interface circuit 230 issues an address input command "00h", for example, under the control of the sequencer 250, and transmits the command to the NAND-type flash memory 100. Subsequently, an address ADD is transmitted to the NAND-type flash memory 100, for example, for 5 clock cycles, and then a read command "30h" is issued and transmitted to the NAND-type flash memory 100. The address ADD includes addresses indicating a block, a page, and a column, held in the address register 290 in the operations illustrated in FIGS. 8 and 10.

An operation of reading data from the memory cell array 110 is started in the NAND-type flash memory 100 in response to the command "30h", and thus the NAND-type flash memory 100 is brought into a busy state (/RB="L").

If reading of the data from the memory cell array 110 is completed, the NAND-type flash memory 100 is brought into a ready state. The controller 200 toggles the signal /RE in response thereto. Then, the data are transmitted from the NAND-type flash memory 100 to the controller 200 in synchronization with the signal /RE.

1.2.2 Writing Operation

Next, the writing operation will be described. The writing operation includes the following three steps.

(1) Transmission of data from the host apparatus 500 to the controller 200

(2) Writing of the transmitted data to the NAND-type flash memory 100

(3) Feature table reading (Get feature): Through this step, whether writing of the data to the NAND-type flash memory 100 is passed or failed is determined.

Figure 12:
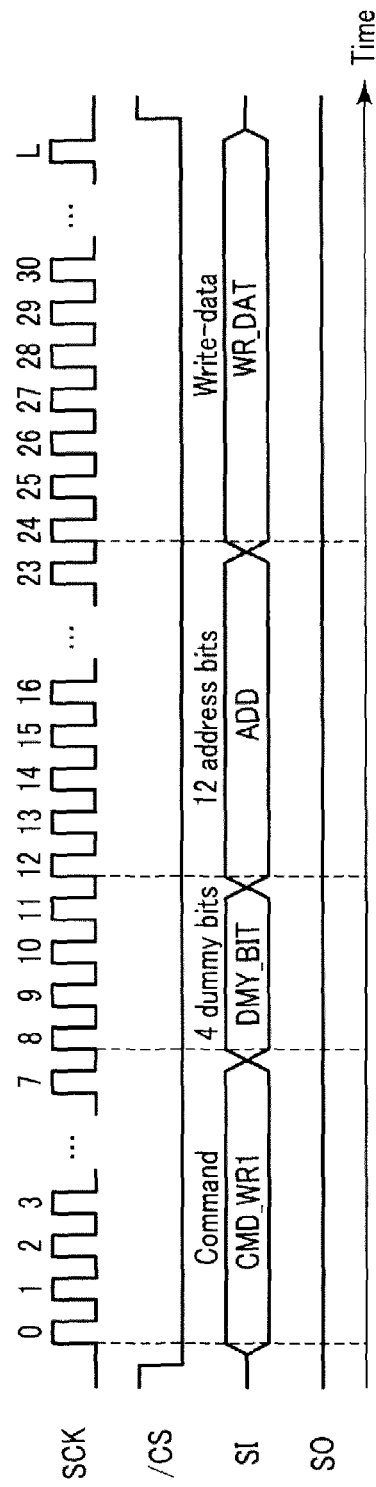
FIGS. 12-14 are timing charts of various signals during writing of data in the memory system according to the embodiment.

FIG. 12 is a timing chart of various signals on the SPI buses during execution of the step (1). As illustrated, the host apparatus 500 asserts the signal /CS, issues a first write command CMD_WR1 as the signal SI, and also issues the clock SCK. If the first write command CMD_WR1 is received, the sequencer 250 starts a data writing sequence.

Next, the host apparatus 500 transmits dummy bits DMY_BIT to the controller 200, for example, for 4 clock cycles, and then transmits an address ADD to the controller 200, for example, for 12 clock cycles. The address ADD designates a region in the data buffer 260 or 270, and designates a column of a page in the NAND-type flash memory 100. The address ADD is held in the address register 290. The host apparatus 500 transmits data to be written WR_DAT to the controller 200. The data to be written WR_DAT is held in the region corresponding to the address ADD received immediately before, in the data buffer 260 or 270. After the data WR_DAT is transmitted, the host apparatus 500 deasserts the signal /CS.

Figure 13:
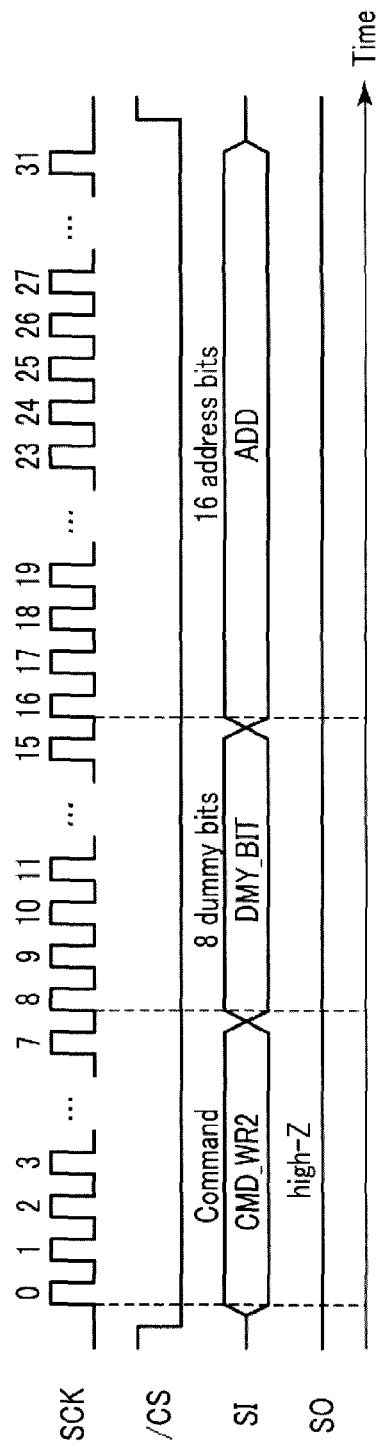

The step (2) is performed following the step (1). FIG. 13 is a timing chart of various signals on the SPI bus during execution of the step (2). As illustrated, the host apparatus 500 asserts the signal /CS again, issues a second write command CMD_WR2 as the signal SI, and also issues the clock SCK. If the second write command CMD_WR2 is received, the sequencer 250 recognizes that a command for the step (2) is received.

Next, the host apparatus 500 transmits 8 dummy bits DMY_BIT to the controller 200, for example, for 8 clock cycles, and then transmits a 16-bit address ADD to the controller 200, for example, for 16 clock cycles. The address ADD designates a block and a page in the NAND-type flash memory 100, and is held in the address register 290. After the address ADD is transmitted, the host apparatus 500 deasserts the signal /CS.

The step (3) is performed following the step (2). A command sequence in this operation is the same as in FIG. 9 referred to for description of the reading operation. If the received status data ST_DAT indicates that the memory system 1 is in a ready state, the host apparatus 500 subsequently requests for information indicating whether writing of data is passed or failed.

Figure 14:
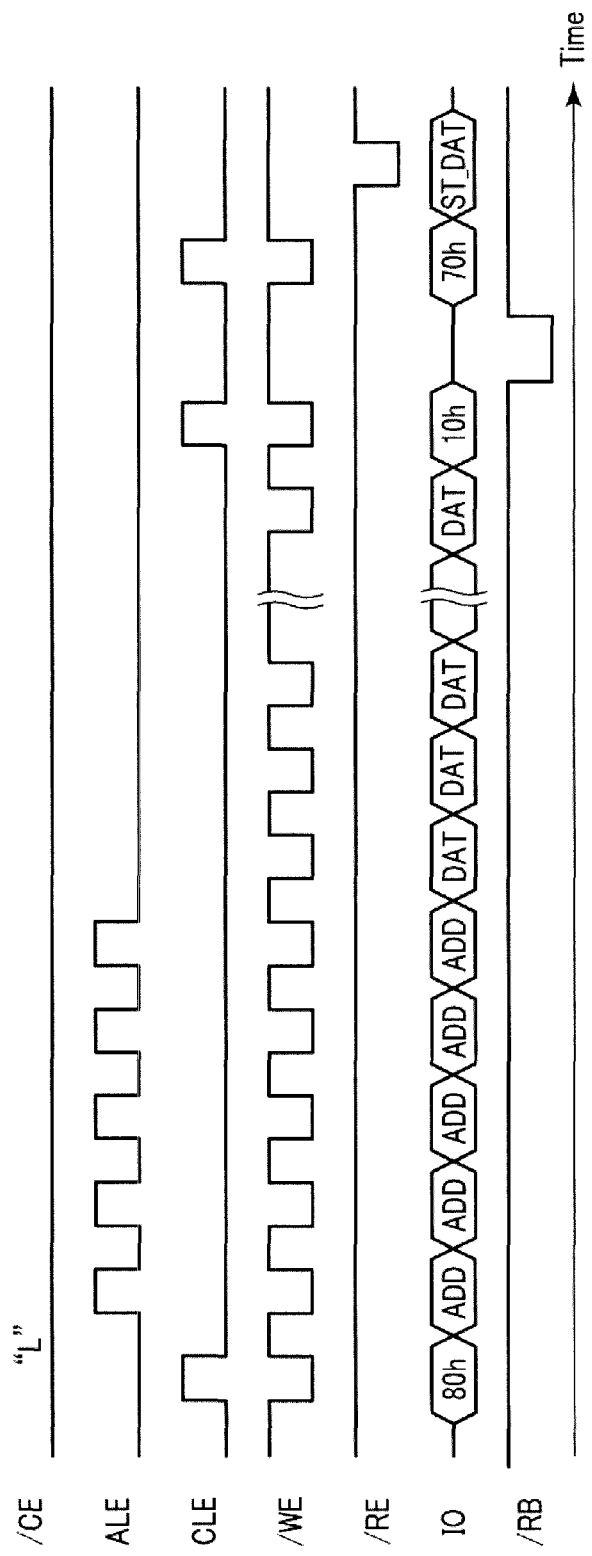

FIG. 14 is a timing chart of various signals on the NAND buses during execution of the step (2). After the second write command CMD_WR2 is received in the controller 200, the NAND interface circuit 230 issues a write command "80h", for example, under the control of the sequencer 250, and transmits the command to the NAND-type flash memory 100. Subsequently, an address ADD is transmitted to the NAND-type flash memory 100, for example, for 5 clock cycles, and data to be written DAT are transmitted to the NAND-type flash memory 100 for a plurality of clock cycles. Then, a write command "10h" is issued and is transmitted to the NAND-type flash memory 100. The address ADD includes addresses indicating a block, a page, and a column, held in the address register 290 in the operations illustrated in FIGS. 12 and 13.

An operation of writing the data to the memory cell array 110 is started in the NAND-type flash memory 100 in response to the command "10h", and thus the NAND-type flash memory 100 is brought into a busy state (/RB="L").

If writing of the data to the memory cell array 110 is completed, the NAND-type flash memory 100 is brought into a ready state. The controller 200 reads a status, issues a command "70h", and toggles the signal /RE, in response thereto. Then, status data ST_DAT indicating whether the writing operation is passed or failed is transmitted to the controller 200 in synchronization with the signal /RE. The status data ST_DAT is held in the feature table, and is read to the host apparatus 500 in response to the Get feature command in the step (3).

1.2.3 Erasing Operation

Next, the erasing operation will be described. The erasing operation includes the following two steps.

(1) An erase (delete) command is issued from the host apparatus 500 to the controller 200.

(2) Feature table reading (Get feature): Through this step, whether the erasing operation on the NAND-type flash memory 100 is passed or failed is determined.

Figure 15:
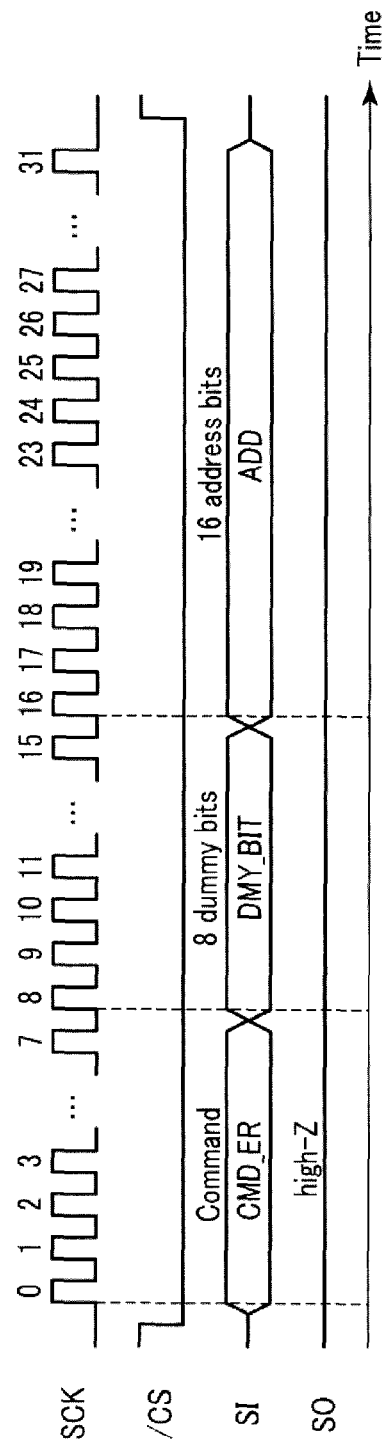
FIGS. 15-16 are timing charts of various signals during erasing of data in the memory system according to the embodiment.

FIG. 15 is a timing chart of various signals on the SPI buses during execution of the step (1). As illustrated, the host apparatus 500 asserts the signal /CS, issues an erase command CMD_ER as the signal SI, and also issues the clock SCK. If the erase command CMD_ER is received, the sequencer 250 starts a data erasure sequence.

Next, the host apparatus 500 transmits 8 dummy bits DMY_BIT to the controller 200, for example, for 8 clock cycles, and then transmits a 16-bit address ADD to the controller 200, for example, for 16 clock cycles. The address ADD designates an erasure target block in the memory cell array 110, and is held in the address register 290. Subsequently, the host apparatus 500 deasserts the signal /CS.

The step (2) is performed following the step (1). A command sequence in this operation is the same as in FIG. 9 referred to for description of the reading operation. If the received status data ST_DAT indicates that the memory system 1 is in a ready state, the host apparatus 500 subsequently makes a request for information indicating whether erasure of the data is passed or failed.

Figures 16, 17:
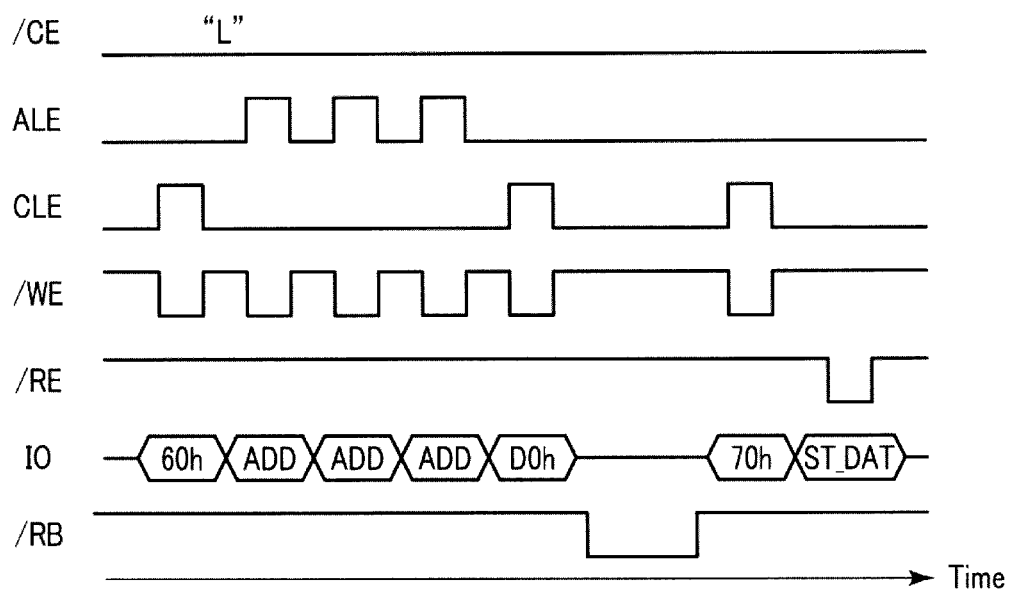
FIG. 17 illustrates an example of information indicating a protection target block in a NAND-type flash memory of the memory system according to the embodiment.

FIG. 16 is a timing chart of various signals on the NAND buses during execution of the step (1). After the erase command CMD_ER is received in the controller 200, the NAND interface circuit 230 issues a write command "60h", for example, under the control of the sequencer 250, and transmits the command to the NAND-type flash memory 100. Subsequently, an address ADD is transmitted to the NAND-type flash memory 100, for example, for 3 clock cycles, and then an erase command "D0h" is issued and is transmitted to the NAND-type flash memory 100.

An operation of erasing data from the memory cell array 110 is started in the NAND-type flash memory 100 in response to the command "D0h", and thus the NAND-type flash memory 100 is brought into a busy state (/RB="L").

If erasing of the data from the memory cell array 110 is completed, the NAND-type flash memory 100 is brought into a ready state. The controller 200 issues a status read command "70h", and toggles the signal /RE, in response thereto. Then, status data ST_DAT indicating whether the erasing operation is passed or failed is transmitted to the controller 200 in synchronization with the signal /RE. The status data ST_DAT is held in the feature table, and is read to the host apparatus 500 in response to the Get feature command during the step (2).

1.3 Block Protection

Next, block protection according to the present embodiment will be described.

1.3.1 Block Protection Function

If the memory system 1 according to the present embodiment receives a specific command requesting a certain user block of the NAND-type flash memory 100 to be protected from the host apparatus 500, the memory system 1 carries out a function of protecting the block. The specific command is referred to as a block protection command. The protection here is to prohibit data from being erased from or written into a user block which is designated as a protection target by the host apparatus 500. The control function is achieved by, for example, the sequencer 250 and the block protection register 700 of the controller 200. Specifically, if a command recognized by the host interface circuit 220 is the block protection command, the sequencer 250 performs a process for protecting the block.

The block protection command is a command requesting to prohibit data from being erased from or written into a certain user block of the NAND-type flash memory 100. An address included in a command sequence indicates the protection target block. The sequencer 250 performs a process for protecting the block, and prohibits data from being erased from or written into the protection target block if there is an erase command or a write command with respect to the protection target block.

1.3.2 Storing of Information Indicating Protection Target Block

A storage area (block protection register 700) for storing information indicating a protection target block of the NAND-type flash memory 100 is provided in the controller 200. The storage area is an area which cannot be accessed by, for example, the host apparatus 500. The information indicating a protection target block is stored in the block protection register 700, for example, as illustrated in FIG. 17. In FIG. 17, a flag is set to an entry corresponding to an address of a protection target block as the information indicating whether or not a block is the protection target block. For example, "1" may be stored in an entry corresponding to a protection target block, and, for example, "0" may be stored in an entry corresponding to a block which is not a protection target.

1.3.3 Type of Block Protection Command

In the present embodiment, a Protect Execute command "11h" is prepared as the block protection command.

The Protect execute command can set only some user blocks which are predefined by the controller 200 as protection targets and cannot set other user blocks as protection targets.

When the sequencer 250 processes the Protect Execute command, the sequencer 250 determines whether or not a block which is requested to be protected by the Protect execute command is a protectable user block, and does not perform the process requested by the Protect execute command if the block is not a protectable user block.

The sequencer 250 can set or change a protectable user block in accordance with the Protect execute command. The set information is stored in a predetermined area of the controller 200, and in a predetermined area of the feature table in the status register 280.

The sequencer 250 may set, in advance, the host apparatus 500 which can use the Protect execute command.

The present embodiment shows an example of the memory system which can process the Protect execute command as a block protection command.

1.3.4 Block Protection Operation

Next, the block protection operation will be described. The block protection operation includes the following two steps.

(1) The block protection operation is performed by the controller 200.

(2) Feature table reading (Get feature): Through this step, whether or not the block protection operation is passed or failed is determined.

Figure 18:
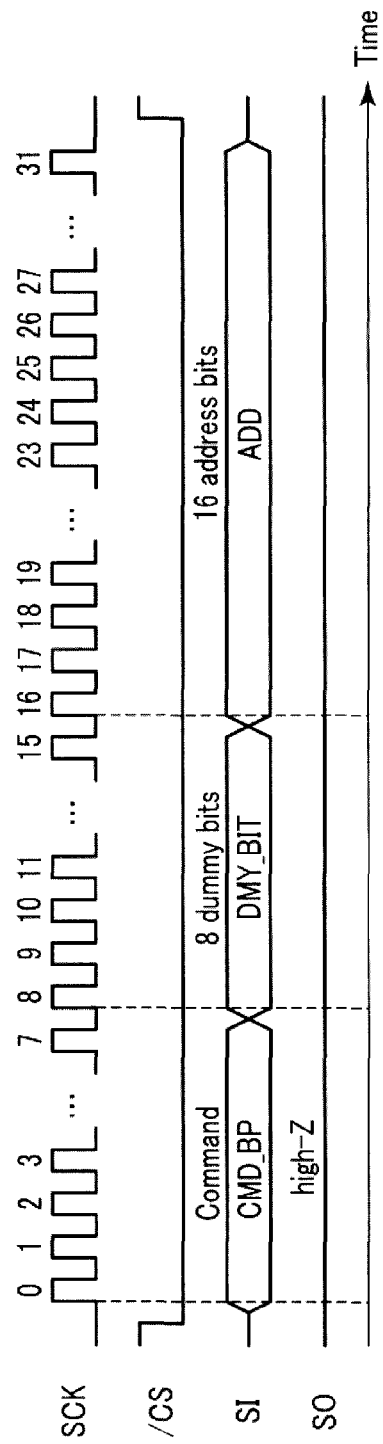
FIG. 18 is a timing chart of various signals during a block protection operation of the memory system according to the embodiment.

FIG. 18 is a timing chart of various signals on the SPI buses during execution of the step (1). As illustrated, the host apparatus 500 asserts the signal /CS, issues the block protection command CMD_BP ("11h") as the signal SI, and also issues the clock SCK. If the block protection command CMD_BP is received, the sequencer 250 starts a block protection sequence.

Next, the host apparatus 500 transmits 8 dummy bits DMY_BIT to the controller 200, for example, for 8 clock cycles, and then transmits a 16-bit address ADD to the controller 200, for example, for 16 clock cycles. The address ADD designates a block to be a block protection target in the memory cell array 110, and is held in the address register 290. Thereafter, the host apparatus 500 deasserts the signal /CS.

After the block protection command CMD_BP is received by the controller 200, a flag indicating block protection is written into a target entry of the block protection register 700 of the controller 200, for example, under the control of the sequencer 250.

If the block protection operation is completed in the controller 200, the memory chip 100 is brought into a ready state. The host apparatus 500 can recognize that the memory chip 100 is in a ready state by sending the Get feature command.

1.3.5 Flow of Block Protection Operation

Figure 19:
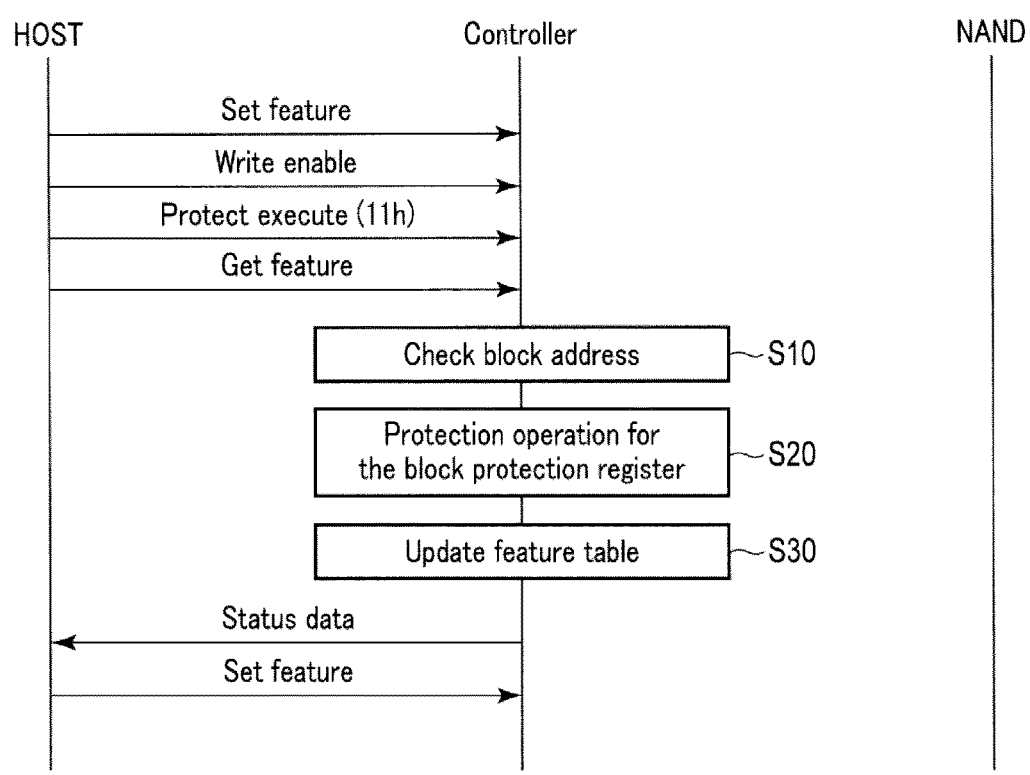
FIG. 19 is a flowchart illustrating the block protection operation in the memory system according to the embodiment.
Figure 20:
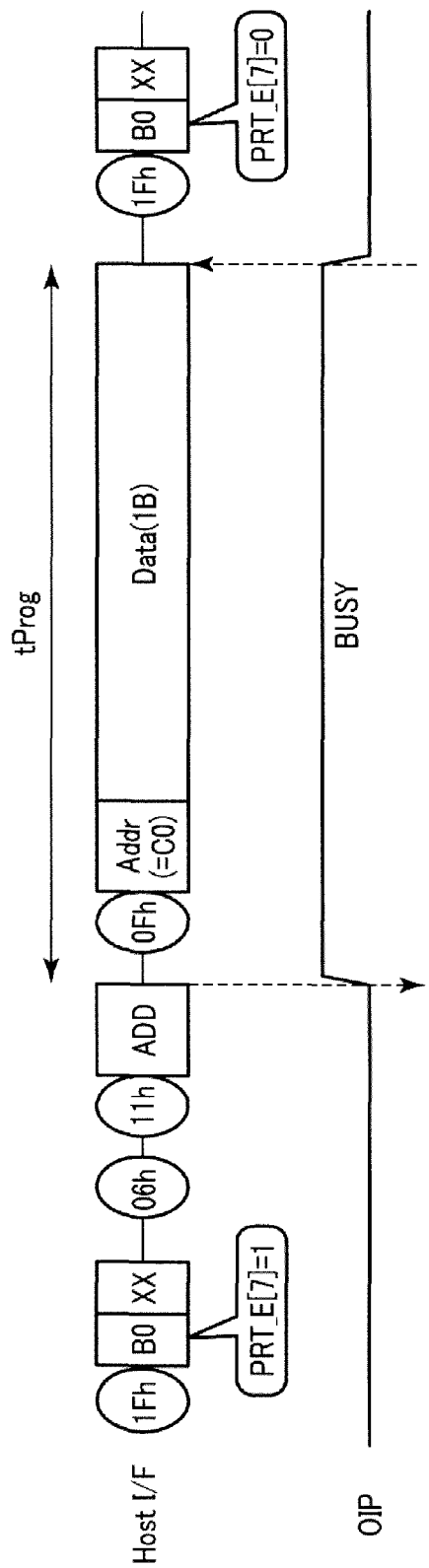
FIG. 20 illustrates a command sequence during the block protection operation in the memory system according to the embodiment.

Next, details of a flow of the block protection operation will be described with reference to FIGS. 19 and 20. FIG. 19 is a flowchart illustrating operations of the host apparatus 500, the controller 200, and the NAND-type flash memory 100 during the block protection operation, and FIG. 20 illustrates a command sequence.

Here, data are assumed to be already written to a block of the NAND-type flash memory 100 on which block protection is performed through the above-described writing operation.

As illustrated, the host apparatus 500 issues a feature table set command (Set feature command) "1Fh" and also a write enable command "06h" before issuing the Protect execute command "11h" which is the block protection command.

Specifically, the host apparatus 500 issues the Set feature command "1Fh" and then information (hereinafter, referred to as "B0 setting information") for setting whether the block protection command is valid or invalid. The B0 setting information includes, for example, an address "B0" in the feature table of the status register 280, and a value of "1" or "0" indicating whether the block protection command is in a valid or invalid state as information held in an entry corresponding to the address "B0".

Here, the host apparatus 500 issues, for example, "PRT_E[7]=1" as the B0 setting information in order to bring the block protection command into a valid state. Then, the sequencer 250 reflects the value "1" indicating that the block protection command is valid in a designated entry of the feature table. Next, the host apparatus 500 issues the write enable command "06h". Then, the sequencer 250 reflects the value "1" indicating that writing of data is enabled in the designated entry of the feature table. Consequently, the host apparatus 500 can use the block protection command.

The host apparatus 500 issues the Protect execute command "11h" as the block protection command, and then the address ADD. In response to the address ADD, the memory system 1 is brought into a busy state, and operation in progress (OIP) in the feature table becomes "1". The OIP is a flag indicating whether the memory system 1 is in a ready state or a busy state, and indicates the ready state with "0" and the busy state with "1". The host apparatus 500 issues a Get feature command "0Fh" and an address "C0", and reads information (1-byte data) regarding an entry including the OIP from the feature table. The entry information is repeatedly transmitted to the host apparatus 500 until the OIP becomes "0" as long as the clock SCK is input (the Get feature command may be repeatedly issued).

When the memory system 1 is brought into a busy state, the controller 200 determines whether or not the block protection command received from the host apparatus 500 is proper (step S10), and writes the flag information into the target entry of the block protection register 700 if the command is proper (step S20).

Thereafter, setting of block protection in the controller 200 is completed, the memory system 1 is brought into a ready state, and, for example, the sequencer 250 changes the OIP in the feature table from "1" to "0".

The controller 200 stores the status data ST_DAT indicating whether execution of the block protection is passed or failed in the feature table (step S30), and outputs the status data if the controller 200 receives the Get feature command from the host apparatus 500.

On the other hand, if the block protection command received from the host apparatus 500 is not proper in step S10, the controller 200 stores, for example, the status data ST_DAT indicating that the block protection operation is failed, in the feature table without writing the flag to the block protection register 700 (step S30). The memory system 1 is brought into a ready state, and, for example, the sequencer 250 changes the OIP in the feature table from "1" to "0". The information may be output if the Get feature command is received from the host apparatus 500.

Finally, the host apparatus 500 issues the Set feature command "1Fh", and issues, for example, "PRT_E[7]=0" as the B0 setting information in order to bring the block protection command into an invalid state. Then, the sequencer 250 sets the value "0" indicating that the block protection command is invalid in a designated entry of the feature table.

Consequently, a series of operations for block protection is completed.

Figure 21:
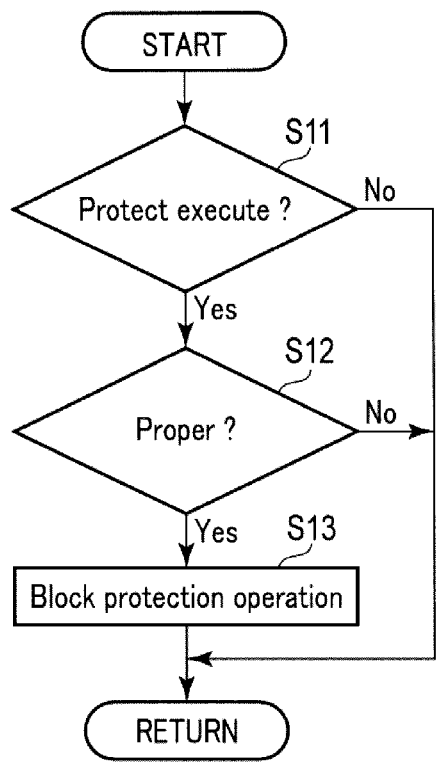
FIG. 21 is a flowchart illustrating a command identification process in the block protection operation performed in the memory system according to the embodiment.

Next, with reference to FIG. 21, a command identification process performed in in step S10 of the flowchart illustrated in FIG. 19 will be described in detail.

If the controller 200 recognizes that the block protection command received from the host apparatus 500 is the Protect execute command "11h" (YES in step S11), the controller 200 determines whether or not the user block designated by the host apparatus 500 is a predefined protectable block (step S12). Specifically, the controller 200 determines whether or not an address included in the command sequence of the Protect execute command is an address of the protectable block which is predefined in a predetermined area of the feature table. If the user block is the protectable block (YES in step S12), the controller 200 regards the command as proper, permits block protection for the user block designated by the host apparatus 500 (step S13), and instructs the block protection register 700 to perform block protection. In other words, the flag information is written into a target entry of the block protection register 700.

On the other hand, if the user block designated by the host apparatus 500 is not a predefined protectable block in step S12 (NO in step S12), the controller 200 regards the command as not proper, and does not perform the block protection operation for the user block designated by the host apparatus 500. In other words, the controller 200 does not instruct the block protection register 700 to perform block protection. In this case, the controller 200 may store, for example, status data indicating that the block protection operation is failed or status data indicating that the command is not proper, in the feature table, and may notify the host apparatus 500 of the status data.

1.3.6 Flow of Operation after Block Protection Operation

Figure 22:
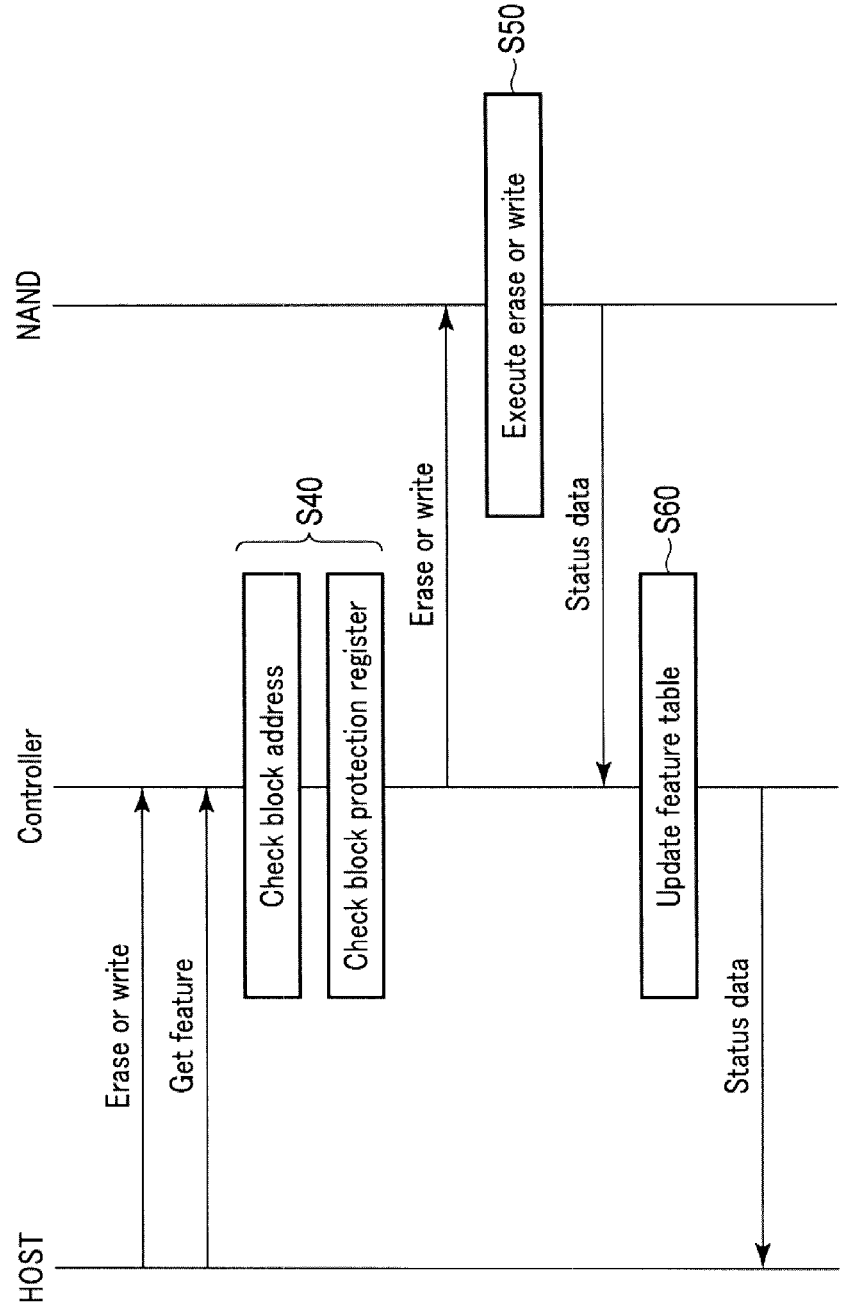
FIG. 22 is a flowchart illustrating an operation after the block protection operation is completed in the memory system according to the embodiment.

Next, with reference to FIG. 22, an operation after the block protection operation is completed will be described. FIG. 22 is a flowchart illustrating operations of the host apparatus 500, the controller 200, and the NAND-type flash memory 100 after the block protection operation is completed.

As illustrated, the host apparatus 500 issues, for example, an erase command or a write command. In response thereto, the memory system 1 is brought into a busy state. The host apparatus 500 also issues the Get feature command.

When the memory system 1 is brought into a busy state, the controller 200 determines whether the command received from the host apparatus 500 is an erase command or a write command for a block for which protection is set in the block protection register 700 (step S40). If the command is not an erase command or a write command for a block for which protection is set, the controller 200 permits the command received from the host apparatus 500 to be accepted and issues a corresponding command to the NAND-type flash memory 100. Consequently, the NAND-type flash memory 100 is brought into a busy state. Erasing or writing of data from or to the memory cell array 110 is executed (step S50).

Thereafter, erasing or writing of data from or to the memory cell array 110 is completed, and the NAND-type flash memory 100 is brought into a ready state. In response thereto, if the controller 200 issues a status read command, status data indicating whether or not the erasing operation or the writing operation is passed or failed is transmitted from the NAND-type flash memory 100 to the controller 200. The controller 200 stores the status data in the feature table (step S60) and notifies the host apparatus 500 of the status data.

On the other hand, if the command received from the host apparatus 500 is an erase command or a write command for a block for which protection is set in step S40, the controller 200 stores, for example, status data indicating that the erase command or the write command is failed in the feature table without issuing the erase command or the write command to the NAND-type flash memory 100 (step S60), and also notifies the host apparatus 500 of the status data.

1.4 Advantage of Present Embodiment

According to the present embodiment, a block protection process can be performed as a separate process. The advantage achieved by the present embodiment will be described below.

Generally, in order to protect a block, a writing operation is performed in a block protection mode or a one-time program (OTP) mode. In other words, data writing and a block protection are performed at the same time. In this case, a protection target block is necessarily determined before data is written.

In view of this limitation, according to the present embodiment, block protection in the NAND-type flash memory 100 is performed as a separate process in response to a specific command requesting the block protection. In other words, a block protection operation is performed separately from a normal operation (a writing operation or the like). For this reason, the host apparatus 500 can give an instruction to perform a protection process selectively on a desired block among some blocks into which data have been already written.

According to the present embodiment, the controller 200 can restrict a protection target block. Since a protectable user block is restricted, excessive block protection setting performed by the host apparatus 500 can be prevented, and thus a storing area which can be used to write data can be prevented from being reduced. If the controller 200 sets all blocks as protection target blocks, since a protectable user block is not restricted, the host apparatus 500 can set any user block as a protection target and can thus freely determine a size of a storing area to be protected.

2. Modification Examples and the Like

In the above embodiment, the memory system processes the Protect execute command as a block protection command, but the block protection command is not limited thereto. For example, a memory system may process a plurality of types of block protection commands. In this case, a dedicated command may be prepared for each target block for which protection can be set.

In the above embodiment, as described with reference to FIG. 22, in both of a case (first case) where an access command for a non-protection target block is received, and an operation is failed, and a case (second case) where an access command for a protection target block is received, information of the failure is stored in the feature table as status data. In these cases, the status data for the first case and the second case may be stored in the feature table separately. In other words, pass or fail information for the first case and the second case may be stored in different entries, or may be stored in the same entry but may be stored in different bits.

Figure 23:
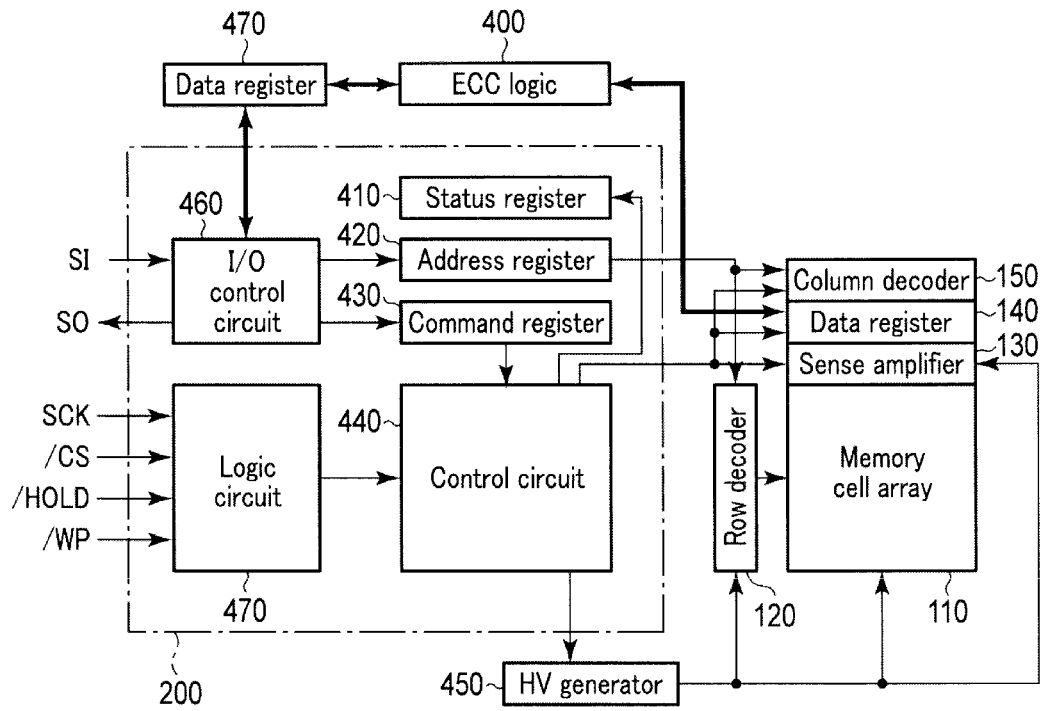
FIG. 23 is a block diagram of a memory system according to a modification example of the embodiment.

Embodiments are not limited to the above-described embodiments and may have various modifications. For example, in the above-described embodiments, the NAND-type flash memory 100 and the controller 200 are separate semiconductor chips. However, the elements may be formed of one chip. FIG. 23 is a block diagram of the memory system 1 in this case.

As illustrated, a block configuration is the same as in FIG. 7, but the signals SCK, /CS, /HOLD, and /WP from the host apparatus 500 are input to the logic circuit 470, and the signals SI and SO are input and output via the input/output control circuit 460. The registers 410 to 430, the control circuits 440 and 460, and the logic circuit 470 function as the controller 200. In other words, the control circuit 440 functions as the sequencer 250 and the host interface circuit 220, and distinguishes commands from the host apparatus 500 from each other by using the signal /CS. The input/output control circuit 460 and the logic circuit 470 function as the host input/output circuit 210. The registers 410 and 420 function as the registers 280 and 290, and the feature table is held in, for example, the status register 410 or the like.

The respective processes in the above-described flowcharts may be changed in order of the processes as appropriate. For example, the Get feature command illustrated FIG. 19 or the like may be issued at any timing, and may be issued, for example, before the process in step S10 is performed.

The timing charts described in the above embodiments are only examples. The number of clock cycles which are required to input the signal SI and the number of clock cycles which are required to output the signal SO are not limited to those in the embodiments. In addition, the case where dummy bits are input immediately after a command is issued depending on the command is described as an example, and should not be viewed as limiting. This is also the same for the feature table. That is, the feature table is not limited to the form described in the above embodiments as long as the information described in the embodiments can be held therein.

Figure 24:
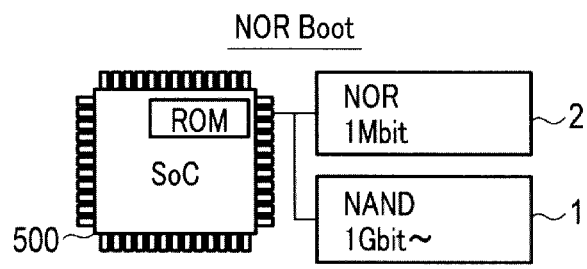
FIGS. 24 and 25 are each a conceptual diagram of a system using the memory system according to the embodiment.

The memory systems described in each of the above embodiments may be applied to, for example, a television set or a set top box. FIG. 24 illustrates an example of such a system. In this example, an NOR-type flash memory 2 is provided in addition to the memory system 1. Both the memory system 1 and the NOR-type flash memory 2 are connected to an SPI interface. In this example, commands (the commands CMD_RD1, CMD_RD2, CMD_GF, and CMD_SF, and the like) for controlling the memory system 1 are held in the NOR-type flash memory 2. During activation of the host apparatus 500, the host apparatus 500 reads the command information from the NOR-type flash memory 2 according to a sequence held in a ROM of the host apparatus 500. Then, the host apparatus 500 reads an activation sequence from the memory system 1 by using the command information, and the application is activated by executing the activation sequence.

Figure 25:
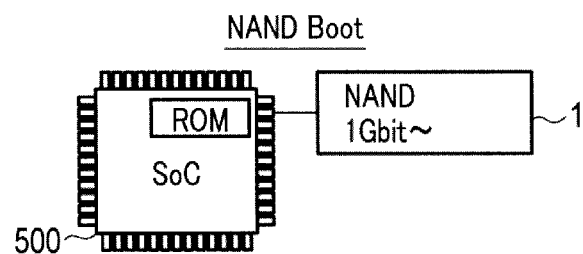

Alternatively, if the command information regarding the memory system 1 is held in the ROM of the host apparatus 500, the NOR-type flash memory 2 may be omitted as illustrated in FIG. 25.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:
a semiconductor memory chip; and
a controller chip configured to communicate with an external device through an interface conforming to Serial Peripheral Interface (SPI) and receive a plurality of first control signals from the external device, the first control signals including a chip select signal by which the controller chip is activated, and register a portion of the semiconductor memory chip designated in a protection command received from the external device as a protected portion, wherein
the controller chip includes an input/output circuit configured to communicate a plurality of second control signals to the semiconductor memory chip, the second control signals including a chip enable signal by which the controller chip activates the semiconductor memory chip, and
when the controller chip receives from the external device a command to erase the protected portion or write to the protected portion, the controller chip does not perform an erase operation or a write operation requested by the received command and notifies the external device of failure to execute the received command.

2. The memory system according to claim 1, wherein the controller chip registers the designated portion as the protected portion, after a write command has been issued to write into the portion.

3. The memory system according to claim 1, wherein the controller chip is further configured to determine whether or not the designated portion is eligible for protection, and
when the designated portion is determined to be eligible for protection, the designated portion is registered as the protected portion.

4. The memory system according to claim 3, wherein the controller chip is configured to determine eligibility for the protection, based on protection settings stored in a storage region that specify one or more portions of the semiconductor memory chip that are eligible for protection.

5. The memory system according to claim 3, wherein when the designated portion is determined to be ineligible for protection, the controller chip does not register the designated portion as the protected portion.

6. The memory system according to claim 5, wherein
when the designated portion is determined to be ineligible for protection, the controller chip transmits a notification to the external device that the protection command is denied.

7. The memory system according to claim 1, wherein
the controller chip is further configured to register whether or not the registration of protected portions based on the protection command is enabled, based on a setting command that is different from the protection command.

8. The memory system according to claim 1, wherein
the protection command includes no request for writing data in the protected portion.

9. A memory system, comprising:
a first pin through which a chip select signal is received from an external device;
a second pin through which a signal is output to the external device;
a third pin through which a signal is received from the external device;
a fourth pin through which a clock is received from the external device;
a semiconductor memory chip; and
a controller chip configured to receive the chip select signal from the external device through the first pin, the controller chip being activated by the chip select signal, recognize that a first portion of the signal received by the third pin in synchronization with the clock after assertion of the chip select signal is a command, and register a portion of the semiconductor memory chip designated in a protection command received from the external device as a protected portion, wherein
the controller chip includes an input/output circuit configured to communicate a plurality of second control signals to the semiconductor memory chip, the second control signals including a chip enable signal by which the controller chip activates the semiconductor memory chip, and
when the controller chip receives, by the third pin, a command to erase the protected portion or write to the protected portion, the controller chip does not perform an erase operation or a write operation requested by the received command and notifies the external device of failure to execute the received command.

10. The memory system according to claim 9, wherein
the controller chip registers the designated portion as the protected portion, after a write command has been issued to write into the portion.

11. The memory system according to claim 9, wherein
the controller chip is further configured to determine whether or not the designated portion is eligible for protection, and
when the designated portion is determined to be eligible for protection, the designated portion is registered as the protected portion.

12. The memory system according to claim 11, wherein
the controller chip is configured to determine eligibility for the protection, based on protection settings stored in a storage region that specify one or more portions of the semiconductor memory chip that are eligible for protection.

13. The memory system according to claim 11, wherein
when the designated portion is determined to be ineligible for protection, the controller chip does not register the designated portion as the protected portion.

14. The memory system according to claim 13, wherein
when the designated portion is determined to be ineligible for protection, the controller chip transmits a notification to the external device that the protection command is denied.

15. The memory system according to claim 9, wherein
the controller chip is further configured to register whether or not the registration of protected portions based on the protection command is enabled, based on a setting command that is different from the protection command.

16. The memory system according to claim 9, wherein
the protection command includes no request for writing data in the protected portion.

17. The memory system according to claim 1, wherein the semiconductor memory chip includes a command register, a control circuit configured to control the semiconductor memory chip based on commands held in the command register, and a status register holding information provided from the control circuit indicating whether or not an operation is successful or unsuccessful.

18. The memory system according to claim 9, wherein the semiconductor memory chip includes a command register, a control circuit configured to control the semiconductor memory chip based on commands held in the command register, and a status register holding information provided from the control circuit indicating whether or not an operation is successful or unsuccessful.

* * * * *